United States Patent
Cho et al.

(10) Patent No.: US 11,300,824 B2
(45) Date of Patent: **\*Apr. 12, 2022**

(54) BACKPLANE SUBSTRATE INCLUDING IN-CELL TYPE TOUCH PANEL, LIQUID CRYSTAL DISPLAY DEVICE USING THE SAME, AND METHOD OF MANUFACTURING THE SAME

(71) Applicant: LG Display Co., Ltd., Seoul (KR)

(72) Inventors: Seong-Pil Cho, Gyeonggi-do (KR); Seon-Yeong Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/110,032

(22) Filed: Dec. 2, 2020

(65) Prior Publication Data

US 2021/0173247 A1     Jun. 10, 2021

Related U.S. Application Data

(60) Continuation of application No. 16/551,658, filed on Aug. 26, 2019, now Pat. No. 10,935,829, which is a (Continued)

(30) Foreign Application Priority Data

Nov. 10, 2015  (KR) ........................ 10-2015-0157500

(51) Int. Cl.
*G02F 1/1333*    (2006.01)
*H01L 27/12*     (2006.01)
(Continued)

(52) U.S. Cl.
CPC .... *G02F 1/13338* (2013.01); *G02F 1/136227* (2013.01); *H01L 27/124* (2013.01);
(Continued)

(58) Field of Classification Search
None
See application file for complete search history.

(56) References Cited

U.S. PATENT DOCUMENTS

| 5,637,187 A | 6/1997 | Takasu et al. |
| 5,729,312 A | 3/1998 | Yamagishi et al. |

(Continued)

FOREIGN PATENT DOCUMENTS

| CN | 1120177 A | 4/1996 |
| CN | 102931139 A | 2/2013 |
| CN | 202888179 U | 4/2013 |
| JP | S53-99959 A | 8/1978 |
| KR | 10-2011-0112695 A | 10/2011 |

OTHER PUBLICATIONS

Office Action dated Feb. 3, 2020, issued in corresponding Chinese Patent Application No. 201611040605.9.

*Primary Examiner* — Ashok Patel
(74) *Attorney, Agent, or Firm* — Morgan, Lewis & Bockius LLP

(57) ABSTRACT

The present invention is for a backplane substrate including an in-cell type touch panel advantageous to reducing the number of masks and the number of processes, a liquid crystal display device including the same, and a method of manufacturing the same, includes a plurality of interlayer dielectric layers disposed above a drain electrode of a thin film transistor are simultaneously patterned after forming a sensing line and a common electrode.

19 Claims, 14 Drawing Sheets

Related U.S. Application Data continuation of application No. 16/206,339, filed on Nov. 30, 2018, now Pat. No. 10,394,058, which is a division of application No. 15/348,030, filed on Nov. 10, 2016, now Pat. No. 10,156,749.

(51) Int. Cl.
*G02F 1/1362* (2006.01)
*H01L 29/786* (2006.01)
*G02F 1/1343* (2006.01)

(52) U.S. Cl.
CPC ...... *H01L 27/1248* (2013.01); *H01L 27/1259* (2013.01); *H01L 29/78633* (2013.01); *G02F 1/134372* (2021.01); *G02F 1/136231* (2021.01)

(56) References Cited

U.S. PATENT DOCUMENTS

| | | |
|---|---|---|
| 8,610,127 B2 | 6/2013 | Oh et al. |
| 9,244,313 B2 | 1/2016 | Lee |
| 9,638,949 B1 | 5/2017 | Kim et al. |
| 10,156,749 B2 | 12/2018 | Cho et al. |
| 10,935,829 B2 * | 3/2021 | Cho ................. H01L 29/78633 |
| 2003/0201436 A1 | 10/2003 | Kim |
| 2008/0035999 A1 | 2/2008 | Kim |
| 2013/0153907 A1 | 6/2013 | Oh et al. |
| 2014/0145979 A1 * | 5/2014 | Lee ................... H01L 51/5281 |
| | | 345/173 |
| 2015/0346534 A1 | 12/2015 | Lee |

* cited by examiner

BACKPLANE SUBSTRATE INCLUDING IN-CELL TYPE TOUCH PANEL, LIQUID CRYSTAL DISPLAY DEVICE USING THE SAME, AND METHOD OF MANUFACTURING THE SAME

This application is a continuation of U.S. patent application Ser. No. 16/551,658, filed on Aug. 26, 2019, which is a continuation of U.S. patent application Ser. No. 16/206,339, filed on Nov. 30, 2018, which is a divisional of U.S. patent application Ser. No. 15/348,030, filed on Nov. 10, 2016, which claims the benefit of Korean Patent Application No. 10-2015-0157500, filed on Nov. 10, 2015, the entire disclosure of each of which is hereby incorporated by reference as if fully set forth herein.

BACKGROUND

Field of the Invention

The present invention relates to a display device, and more particularly, to a backplane substrate including an in-cell type touch panel advantageous to reducing the number of masks and the number of processes, a liquid crystal display device using the same, and a method of manufacturing the same.

Discussion of the Related Art

Recently, as the world enters the information age, the field of displays visually showing electric signals has been rapidly improved. Correspondingly, various flat display devices, which are thinner, lighter, and lower in power consumption, have been developed to rapidly replace the existing cathode ray tubes (CRTs).

As examples of flat display devices, there are a liquid crystal display device (LCD), an organic light emitting diode (OLED) device, a plasma display panel (PDP) device, a quantum dot display device, a field emission display (FED) device, an electrophoretic display (EPD) device, etc. Each of these flat display devices essentially includes a flat display panel for displaying an image. The flat display device includes a pair of transparent insulating substrates facing each other while being bonded to each other, and an intrinsic light emitting layer or a polarizing layer interposed therebetween.

A touch panel which can recognize a touch point contacted by a human hand or other input unit and transmit separate information corresponding to the contacted point has been increasingly required. Recently, a touch panel attached to the external surface of the display device is employed.

In addition, touch panels are divided into a resistive type, a capacitive type, and an infrared sensing type according to touch sensing manners. Presently, the capacitive type touch panel is better than other types of touch panels in consideration of ease of fabrication and sensitivity.

Lately, an in-cell type touch panel, in which the touch panel is implemented at the display panel, is in the spotlight because the number of substrates is decreased and a process of bonding substrates is omitted.

However, in the case that the touch panel is disposed in the display panel, touch electrodes for touch sensing are necessary in the display panel. The touch electrodes may be vertically connected to one another not to interfere with thin film transistor in the display panel. Thereby, in manufacture of the backplane substrate, it is difficult to decrease the number of masks. Thus, increase of the number of processes always occurs.

SUMMARY

Accordingly, the present invention is directed to a backplane substrate including an in-cell type touch panel, a liquid crystal display device using the same, and a method of manufacturing the same that substantially obviate one or more problems due to limitations and disadvantages of the related art.

An object of the present invention is to provide a backplane substrate including an in-cell type touch panel advantageous to reducing the number of masks and the number of processes, a liquid crystal display device using the same, and a method of manufacturing the same.

Another object of the present invention is to provide a backplane substrate including an in-cell type touch panel, in which interlayer dielectric layers disposed on a drain electrode of a thin transistor are simultaneously patterned, having advantages in decreased number of masks and the number of processes in manufacturing.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, a backplane substrate including an in-cell type touch panel comprises a substrate including a plurality of pixels in a matrix, a thin film transistor disposed at each pixel of the substrate, a first interlayer dielectric layer covering the thin film transistor, a sensing line disposed on the first interlayer dielectric layer, a second interlayer dielectric layer covering the sensing line, the second interlayer dielectric layer being disposed on the first interlayer dielectric layer, a common electrode disposed at each block including some pixels of a plurality of pixels, the common electrode overlapping the sensing line, a third interlayer dielectric layer covering the common electrode, a pixel electrode connected to the thin film transistor disposed at each pixel through a first interlayer contact hole continuously passing through the third interlayer dielectric layer, the second interlayer dielectric layer, and the first interlayer dielectric layer, and a connection pattern connected to the sensing line through a second interlayer contact hole passing through the third interlayer dielectric layer and the second interlayer dielectric layer to expose the sensing line, the second interlayer contact hole corresponding to a sidewall of the common electrode adjacent to an overlapping region of the sensing line and the common electrode.

The connection pattern may be connected to a side surface of the common electrode and may be partially connected to an upper surface of the common electrode.

The common electrode may be an opening hole identical to the second interlayer contact hole or may have a opening hole larger than the second interlayer contact hole, and the opening hole of the common electrode may partially in contact with a side surface of the connection pattern.

The first interlayer dielectric layer may include a first inorganic insulation layer contacting the thin film transistor and a second inorganic insulation layer disposed on the first inorganic insulation layer, the second inorganic insulation layer contacting lower parts of the second interlayer dielectric layer and sensing line. The first interlayer dielectric layer may further include an organic layer between the first and second inorganic layers, and the organic layer may have an opening larger than the first interlayer contact hole.

The thin film transistor may include a semiconductor layer disposed at a certain part of each pixel, a gate electrode overlapping the semiconductor layer, a gate dielectric layer disposed on the semiconductor layer and the gate dielectric layer interposed between the semiconductor layer and the gate electrode, and source/drain electrodes connected to both ends of the semiconductor layer, and the first interlayer contact hole may be disposed at a part of the drain electrode. The backplane substrate may further include a light shielding pattern overlapping the gate electrode, the light shielding pattern disposed below the semiconductor layer.

In another aspect, a liquid crystal display device including an in-cell type touch panel comprises a substrate including a plurality of pixels in a matrix, a thin film transistor disposed at each pixel of the substrate, a first interlayer dielectric layer covering the thin film transistor, a sensing line disposed on the first interlayer dielectric layer, a second interlayer dielectric layer covering the sensing line, the second interlayer dielectric layer being disposed on the first interlayer dielectric layer, a common electrode disposed at each block including some pixels of a plurality of pixels, the common electrode overlapping the sensing line, a third interlayer dielectric layer covering the common electrode, a pixel electrode connected to the thin film transistor disposed at each pixel through a first interlayer contact hole continuously passing through the third interlayer dielectric layer, the second interlayer dielectric layer, and the first interlayer dielectric layer, a connection pattern connected to the sensing line through a second interlayer contact hole passing through the third interlayer dielectric layer and the second interlayer dielectric layer to expose the sensing line, the second interlayer contact hole corresponding to a sidewall of the common electrode adjacent to an overlapping part of the sensing line and the common electrode, an opposing substrate facing the substrate, and a liquid crystal layer between the substrate and the opposing substrate.

The liquid crystal display device may further include a color filter layer disposed on the substrate or the opposing substrate.

In another aspect, a method of manufacturing a backplane substrate including an in-cell type touch panel comprises preparing a substrate comprising a plurality of pixels in a matrix, providing a thin film transistor at each pixel of the substrate, forming a first interlayer dielectric layer to cover the thin film transistor, forming a sensing line on the first interlayer dielectric layer, forming a second interlayer dielectric layer on the first interlayer dielectric layer to cover the sensing line, forming a common electrode at each block including some pixels of a plurality of pixels, to overlap the sensing line, form a third interlayer dielectric layer to cover the common electrode, forming a first interlayer contact hole passing through the third interlayer dielectric layer, the second interlayer dielectric layer, and the first interlayer dielectric layer to expose a part of the thin film transistor at each pixel, and a second interlayer contact hole corresponding to a sidewall of the common electrode adjacent to an overlapping part of the sensing line and the common electrode, the second interlayer contact hole passing through the third interlayer dielectric layer and the second interlayer dielectric layer to expose the sensing line, and forming a pixel electrode connected to the thin film transistor through the first interlayer contact hole, and a connection pattern connected to the sensing line through the second interlayer contact hole.

In forming the common electrode, the common electrode may include a first opening hole spaced from the pixel electrode and a second opening hole having a size equal to or greater than the second interlayer contact hole.

The first opening hole may be larger than a connection region of the pixel electrode and the thin film transistor, and the connection pattern may be in contact with an edge of the second opening hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of components used in the following description may be selected in consideration of facility of specification preparation. Thus, the names of the components may be different from names of components used in a real product.

Hereinafter, in an in-cell type touch panel, it is supposed that each block includes some pixels (j×k, herein, j and k are natural numbers below m and n) among the entire pixels (m×n, herein, m and n are natural number above 2). These blocks are regularly arranged at the entire pixels. Each block includes a common electrode which is used as an electrode for sensing touch. To this end, in order to apply sequential signals, a contact hole connected to a sensing line formed of metal having high conductivity while being different from the common electrode including a transparent electrode is provided.

Figure 1:
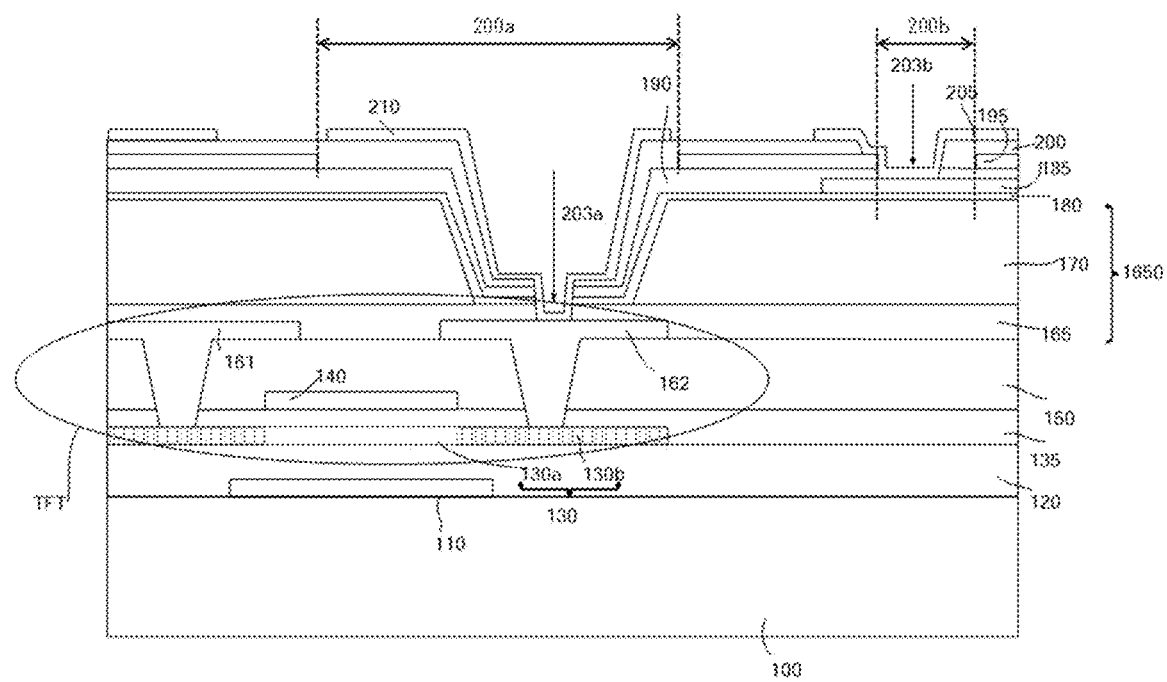
FIG. 1 is a view illustrating a backplane substrate including an in-cell type touch panel according to a first embodiment of the present invention.
Figure 2:
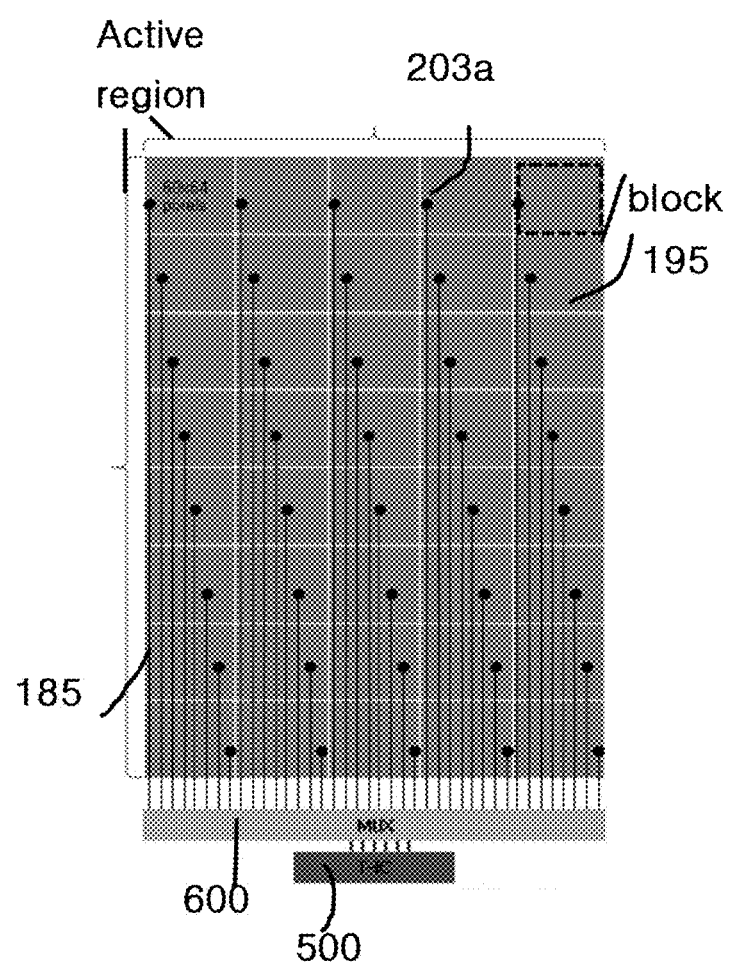
FIG. 2 is a plane view illustrating the backplane substrate including the in-cell type touch panel according to the present invention.

FIG. 1 is a view illustrating a backplane substrate including an in-cell type touch panel according to a first embodiment of the present invention. FIG. 2 is a plane view illustrating the backplane substrate including the in-cell type touch panel according to the present invention. Herein, FIG. 1 is a view corresponding to a circled part of FIG. 2.

As illustrated in FIG. 1, according to the first embodiment of the present invention, the backplane substrate including the in-cell type touch panel includes a substrate 100 including a plurality of pixels arranged in a matrix (see FIG. 2), a thin film transistor TFT disposed at each pixel of the substrate, a first interlayer dielectric layer 1650 covering the thin film transistor TFT, a sensing line 185 disposed on the first interlayer dielectric layer 1650, a second interlayer dielectric layer 190 covering the sensing line 185 while being disposed on the first interlayer dielectric layer 1650, a common electrode 195 disposed at each block which includes some pixels of a plurality of pixels while overlapping the sensing line, a third interlayer dielectric layer 200 covering the common electrode 195, and a pixel electrode 210 connected the thin film transistor TFT disposed at every pixel through a first interlayer contact hole 203a continuously passing through the third interlayer dielectric layer 200, the second interlayer dielectric layer 190, and the first interlayer dielectric layer 1650.

In addition, the backplane substrate further includes a connection pattern 205 disposed at the same level as the pixel electrode 210 to be connected to the sensing line 185 through a second interlayer contact hole 203b passing through the third interlayer dielectric layer 200 and the second interlayer dielectric layer 190 to expose the sensing line 185, while corresponding to a side wall of the common electrode adjacent to an overlapping region between the sensing line 185 and the common electrode 195.

Figure 7:
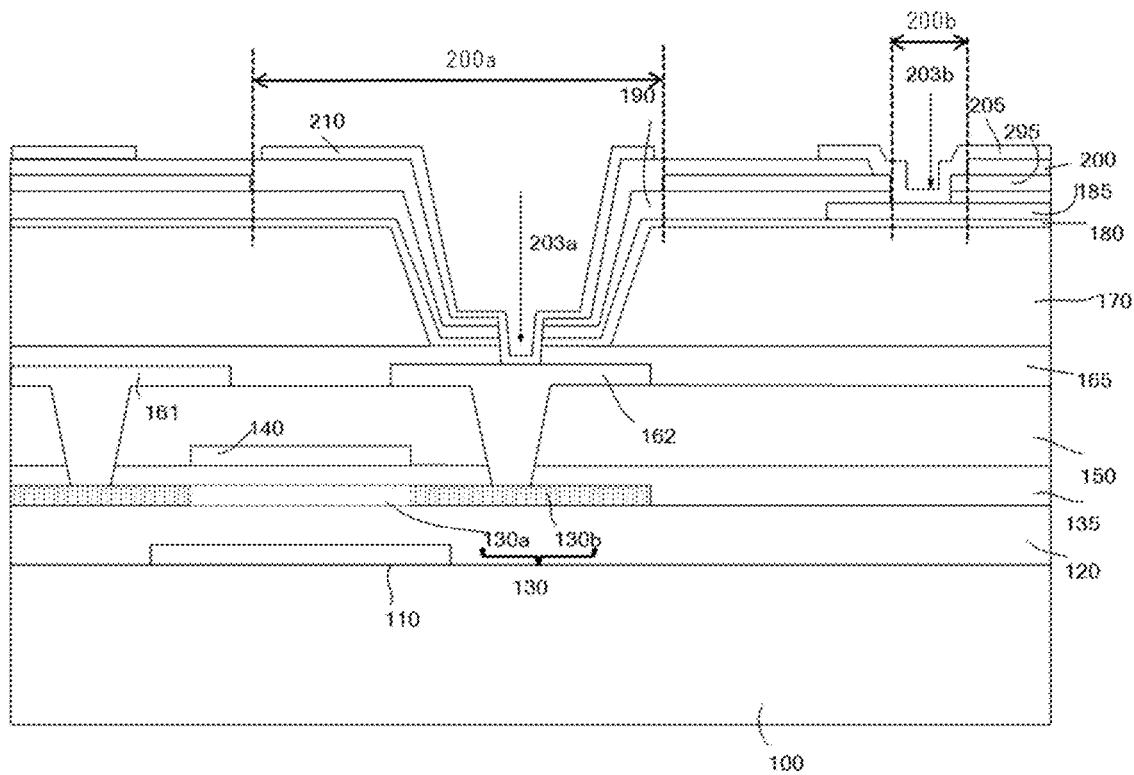
FIG. 7 is a cross-sectional view illustrating a backplane including an in-cell type touch panel according to a second embodiment of the present invention.

Herein, the connection pattern 205 is connected to a side surface of the common electrode 195 and to a part of an upper surface of the common electrode 195. Upon side connection between the connection pattern 205 and the common electrode 195, the common electrode 195 may have a second opening hole 200b larger than the second interlayer contact hole 203b, as illustrated in FIG. 1 and FIG. 4H, which will be described later. Alternatively, the common electrode 195 may have the second opening hole 200b having a diameter identical to the second interlayer contact hole 203b, as illustrated in FIG. 7. In both cases, the side surface of common electrode 195 is connected to the part of the connection pattern 205 while the connection pattern 205 is connected to the sensing line 185 disposed below the common electrode 195 through the second interlayer contact hole 203b such that an electric signal is applied from the sensing line 185 to the common electrode 195 of each block.

According to the present invention, in the backplane substrate including the in-cell type touch panel, connection between the thin film transistor and the pixel electrode, and connection between the sensing line and the common electrode using the connection pattern are performed through the same process. Thereby, the number of masks is decreased and a structural optimization is obtained in comparison with a conventional process in which the described-above connections are formed at different processes.

In addition, for example, as illustrated in FIGS. 1 and 2, one common electrode 195 is provided for every 3 to 100 pixels, and one film transistor TFT and one pixel electrode 210 are disposed at every pixel, respectively. Furthermore, the common electrode 195 is disposed below the pixel electrode 210. The common electrode 195 is disposed to be horizontally spaced from a connection region where the thin film transistor TFT is connected to the pixel electrode 210, in order to prevent short circuit between the common electrode 195 having larger size than the pixel electrode 210 and the pixel electrode 210. Namely, the common electrode 195 has a first opening hole 200a sufficiently spaced from the first interlayer contact hole 203a to prevent contact with the first interlayer contact hole 203a. Furthermore, the second opening hole 200b having a size equal to or greater than the second interlayer hole 203b is provided for side connection between the common electrode 195 and the connection pattern 205. In this case, although the second opening hole 200b is larger than the second interlayer hole 203b, a part of the side of the common electrode 195 corresponding to the second opening hole 200b is on the same plane as the second interlayer hole 203b.

Herein, the pixel electrode 210 may have a region overlapping with the common electrode 195 except for a region where the common electrode 195 is not formed, such as the first and second opening holes 200a and 200b. In this case, the pixel electrode 210 and the common electrode 195 are positioned at different layers, respectively, and the third interlayer dielectric layer 200 for electrical separation is disposed therebetween. Meanwhile, the third interlayer dielectric layer 200 may function to form a storage capacitor at an overlapping region between the common electrode 195 and the pixel electrode 210, which is formed after forming the common electrode 195.

Meanwhile, when the pixel electrode 210 and the connection pattern 205 are formed at the same layer, as described above, the pixel electrode 210 and the connection pattern 205 are horizontally spaced from each other to be electrically separated therebetween. In this case, the pixel electrode 210 serves to display an image of each pixel, and the connection pattern 205 serves to sense touch through electric connection between the sensing line 185 and the common electrode 195 to independently apply and detect signals.

Meanwhile, the first interlayer dielectric layer 1650 includes a first inorganic insulation layer 165 and a second inorganic insulation layer 180. Herein, the first inorganic insulation layer 165 is disposed on the thin film transistor TFT. The second inorganic insulation layer 180 on the first inorganic insulation layer 165 is positioned below the second interlayer dielectric layer 190 and the sensing line 185 to be in contact with the second interlayer dielectric layer 190 and the sensing line 185.

As illustrated, an organic insulation layer 170 may be further provided between the first and second inorganic insulation layers 165 and 180. Herein, the organic insulation layer 170 has an opening larger than the first interlayer contact hole 203a. The organic insulation layer 170 having the opening may be formed to perform a patterning process using a separate mask. Alternatively, in the case that the separate mask is not used to form the organic insulation layer 170, the organic insulation layer 170 may be etched by dry etching when the first interlayer dielectric layer 1650, the second interlayer dielectric layer 190, and the third interlayer dielectric layer 200 are etched by dry etching at the same time.

In addition, the thin film transistor TFT includes a semiconductor layer 130 disposed at a certain region of each pixel region, a gate electrode 140 disposed on the semiconductor layer 130 to overlap with the semiconductor layer 130, a gate dielectric layer 135 between the semiconductor and the gate electrode 140, and, a source electrode 161 and a drain electrode 162 connected to both ends of the semiconductor layer 130. The first interlayer contact hole 203*a* may be disposed on a part of an upper surface of the drain electrode 162.

The semiconductor layer 130 may include polysilicon. Impurities are injected into both ends of the semiconductor layer 130 to define source/drain regions 130*b* in order to be connected to the source electrode 161 and the drain electrode 162. In this case, an uninjected region of the semiconductor layer 130 defines a channel region 130*a*.

Occasionally, when the semiconductor layer 130 includes amorphous silicon or an oxide semiconductor, an impurity layer for low resistance may be further provided or a structural change may be performed. When the semiconductor layer 130 is formed of polysilicon, mobility of the thin film transistor TFT is high. In addition, at least one driver for driving a gate line and a data line which are disposed on the substrate 100 employed as the backplane substrate is embedded in the substrate 100 during formation of the thin film transistor TFT.

Furthermore, a light shielding pattern 110, which overlaps the gate electrode 140 and is disposed below the semiconductor layer 130, is further provided. Thus, the light shielding pattern 110 prevents light from a backlight unit (not shown) disposed at a lower side from interfering with the channel region 130*a* of the semiconductor layer 130.

Herein, the light shielding pattern 110 may be formed of a metallic material. A buffer layer 120 is further provided between the semiconductor layer 130 and the light shielding pattern 110 to prevent electrical interference with the semiconductor layer 130.

Furthermore, a fourth interlayer dielectric layer 150 is further provided between the gate electrode 140 and the source/drain electrodes 161 and 162 to maintain electric isolation between the gate electrode 140 and the source/drain electrodes 161 and 162.

Meanwhile, the reference number 600 is a MUX part for applying sequential signals to common electrodes of blocks disposed at the same row in an active region. The MUX part 600 is connected to a touch driver 500 to receive signals applied to each common electrode 195. Herein, each common electrode 195 is connected to the MUX part 600 through each sensing line 185.

In the backplane substrate including the in-cell type touch panel of the present invention, in terms of a structure in which the pixel electrode is disposed on the common electrode, connection between the pixel electrode and the thin film transistor TFT and connection between the common electrode and sensing line are performed through the same process. Thereby, the number of processes is reduced. In particular, the common electrode is connected to the sensing line through the connection pattern formed at the same layer as the pixel electrode rather than the common electrode being directly connected to the sensing line. Thereby, the number of masks and the number of processes are reduced in comparison with the conventional process, in which connections are formed using different masks.

Hereinafter, a method of manufacturing the backplane substrate including the in-cell type touch panel according to the present invention, referring to drawings.

Figure 3:
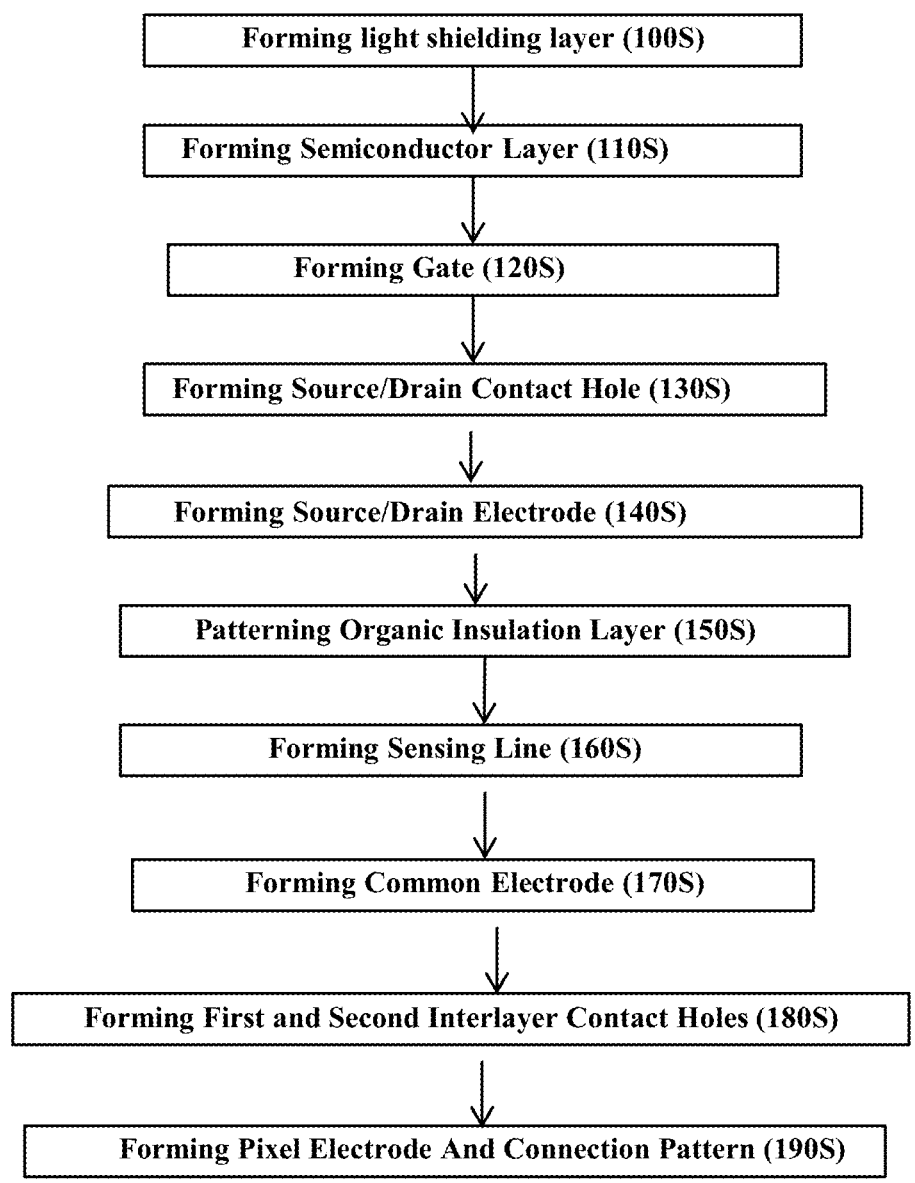
FIG. 3 is a process flowchart of the backplane including the in-cell type touch panel according to the present invention.

Furthermore, FIG. 3 is a process flowchart of the backplane including the in-cell type touch panel according to the present invention. FIGS. 4A to 4J are cross-sectional views illustrating a method of manufacturing the backplane including the in-cell type touch panel according to the first embodiment of the present invention. FIGS. 5A and 5B are plane views illustrating a disposition of common electrode and a pixel electrode in the backplane including the in-cell type touch panel according to the present invention.

Each step shown in FIG. 3 requires a different mask.

Figure 4A:
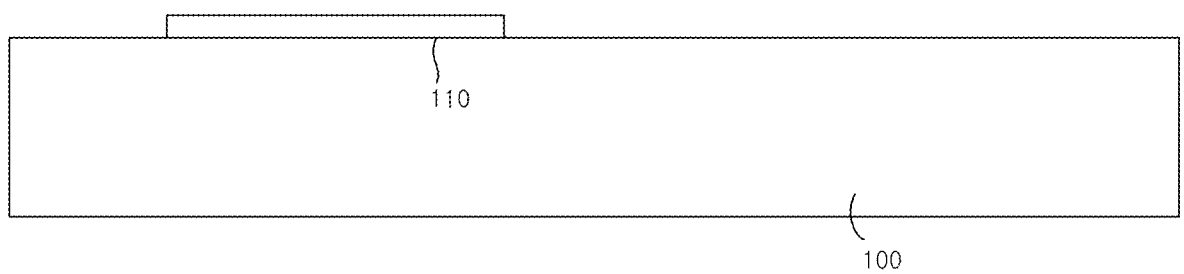
FIGS. 4A to 4J are cross-sectional views illustrating a method of manufacturing the backplane including the in-cell type touch panel according to the first embodiment of the present invention.
Figure 5A:
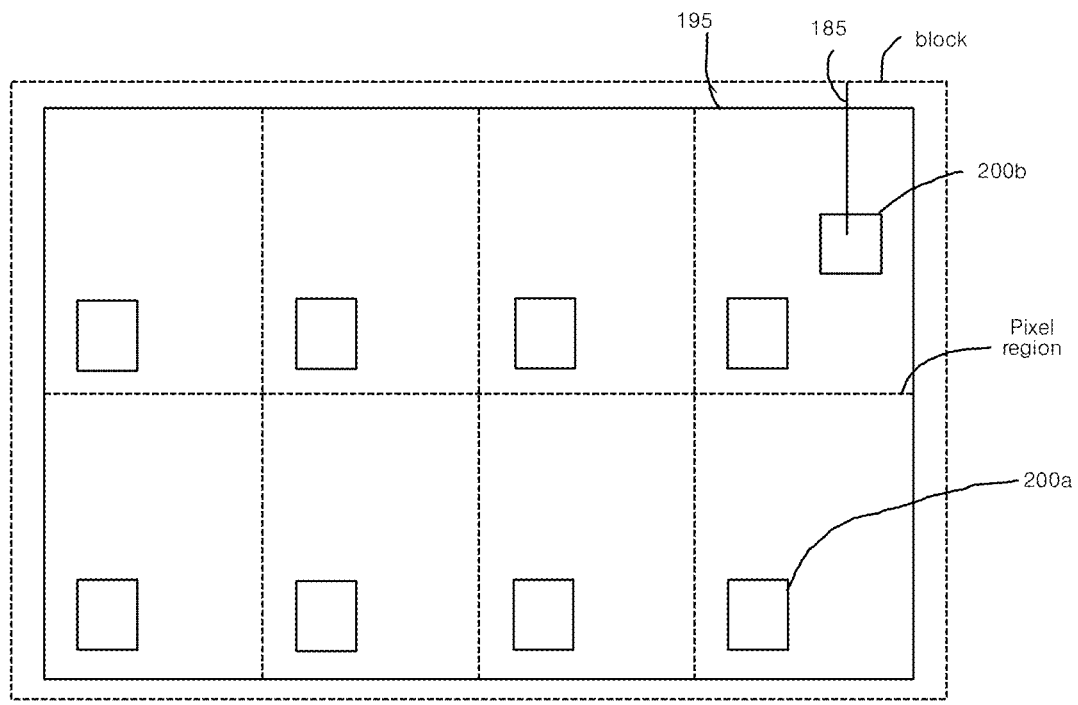
FIGS. 5A and 5B are plane views illustrating a disposition of a common electrode and a pixel electrode in the backplane including the in-cell type touch panel according to the present invention.
Figure 5B:
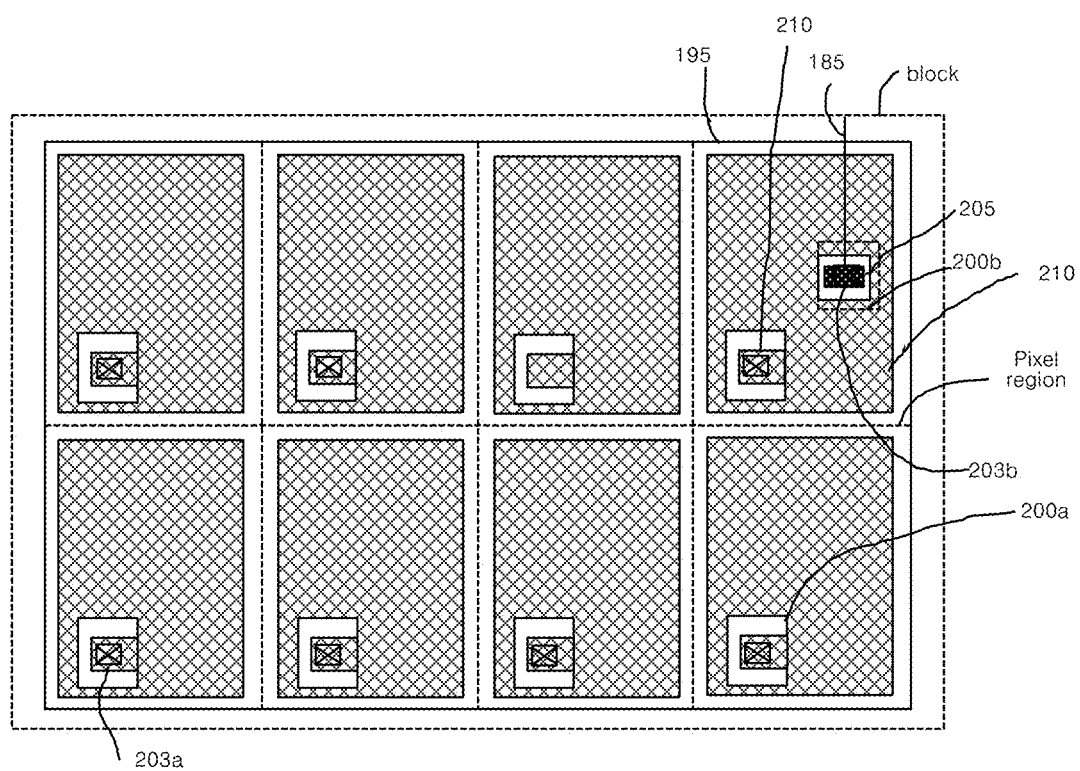

As illustrated in FIGS. 3 and 4A, first, the substrate 100 including a plurality of pixels arranged in a matrix is prepared. Sequentially, metal is deposited on the substrate 100 and is selectively removed using a first mask (not shown) to form the light shielding pattern 110 corresponding to each pixel (100S).

Figure 4B:
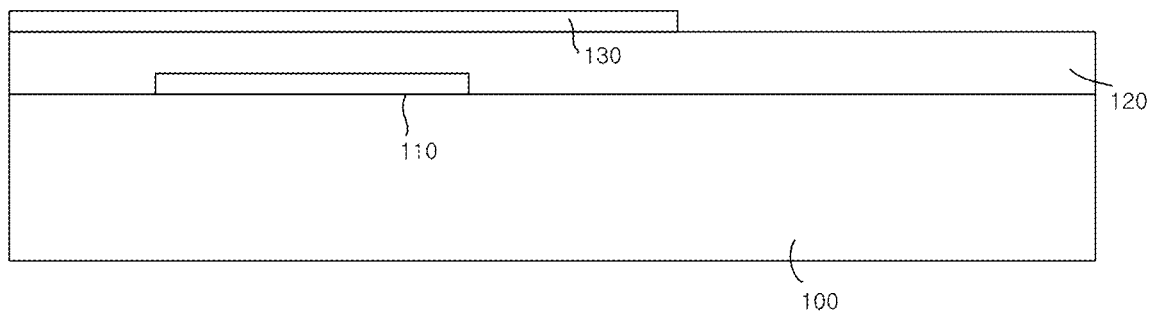

Then, as illustrated in FIG. 4B, the buffer layer 120 is formed on the substrate 100 including the light shielding pattern 110. An amorphous silicon layer is deposited on the buffer layer 120 and then crystallizes. The crystallized silicon layer is selectively removed using a second mask (not shown) to form the semiconductor layer (an active layer, 130), which sufficiently overlaps the light shielding layer 110 (110S).

Figure 4C:
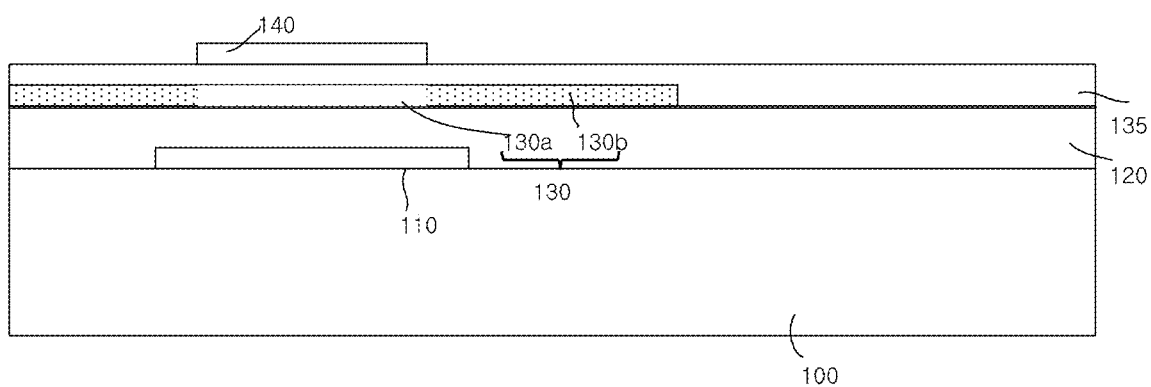

Sequentially, as illustrated in FIG. 4C, the gate dielectric layer 135 is formed on the buffer layer 120 to cover the semiconductor layer 130.

Then, metal is deposited on the gate dielectric layer 135 and is selectively removed using a third mask (not shown) to form the gate electrode 140 which partially covers the semiconductor layer 130 disposed on the light shielding layer 110 (120S). The gate electrode 140 is disposed to have a width less than an inner line width of a gate line (not shown) which is lengthily formed in a one direction to define the pixel electrode of the substrate 100. On the other hand, the gate electrode 140 protrudes from the gate line. The gate electrode 140 receives the same signal as the gate line which is integrated with the gate electrode 140.

Furthermore, an impurity injection process is performed at the exposed semiconductor layer 130 using the gate electrode 140 as a mask to form impurity regions 130*b* at both ends of the semiconductor layer 130. In this process, the semiconductor layer 130 overlapping the gate electrode 140 of an intrinsic region is defined as a channel region 130*a*.

In addition, in the described process of the gate electrode 140, the gate electrode 140 may be formed to have a plurality of separated gates such as a double gate or a triple gate. Thereby, off-current may be stabilized. The channel region 130*a* of the semiconductor may be defined according to shape of the gate electrode 140 and may be selected according to mobility in an on-state and a desired value of off-current in an off-state.

Figure 4D:
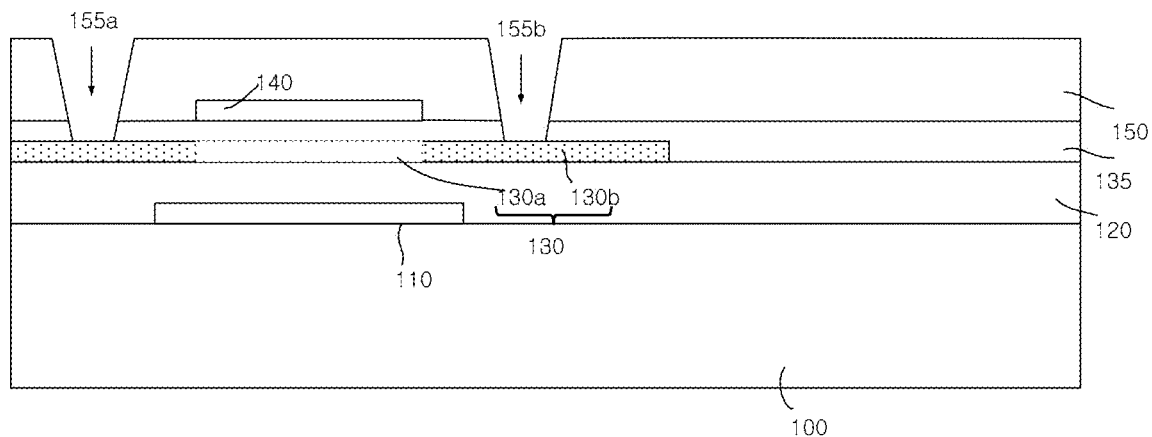

In succession, as illustrated in FIG. 4D, the fourth interlayer dielectric layer 150 is formed on the gate dielectric layer 135 to cover the gate electrode 140. The fourth interlayer dielectric layer 150 and the gate dielectric layer 135 are selectively removed using a fourth mask (not shown) to form a first contact hole 155*a* and a second contact hole 155*b* exposing the impurity regions 130*b* of both ends of the semiconductor layer 130 (130S).

Figure 4E:
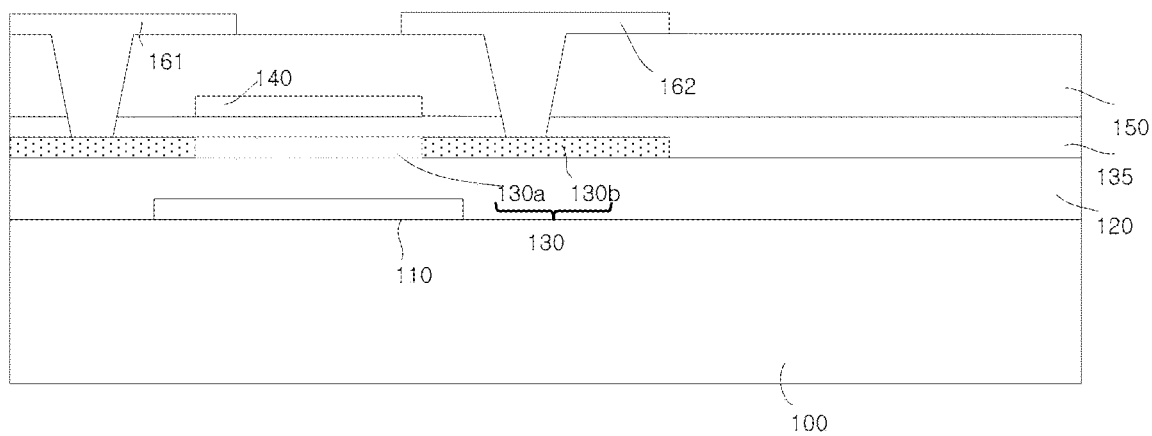

Then, as illustrated in FIG. 4E, metal is deposited on the fourth interlayer dielectric layer 150 having the first and second contact holes 155*a* and 155*b*, and is selectively removed using a fifth mask (not shown) to form the source electrode 161 and the drain electrode 162 connected to the impurity regions 130b of both ends of the semiconductor layer 130 through the first and second contact holes 155a and 155b (140S).

The source electrode 161 is formed to be within a line width of the data line (not shown) crossing the gate line, in which each pixel is defined by the data line and the gate line, or to protrude from the data line. The drain electrode 162 is spaced from the source electrode 161 and is connected to the other impurity region of the semiconductor layer 130. Meanwhile, the data line and gate line crossing the data line define each pixel region.

Figure 4F:
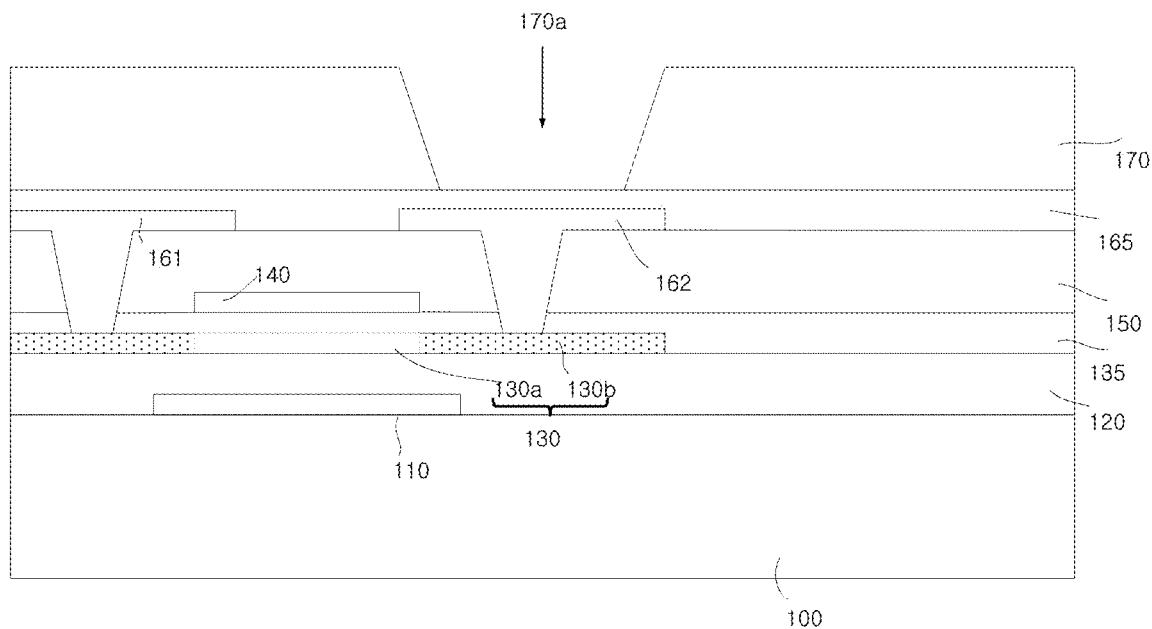

Sequentially, as illustrated in FIG. 4F, the first inorganic layer 165 is entirely deposited to cover the source electrode 161 and the drain electrode 162.

Then, an organic insulation material such as photo acryl is coated and is selectively removed using a sixth mask (not shown) to form the organic insulating layer 170 having an opening hole 170a (150S). The opening hole 170a exposes the drain electrode 162 to have a width corresponding to a width of the drain electrode 162.

Figure 4G:
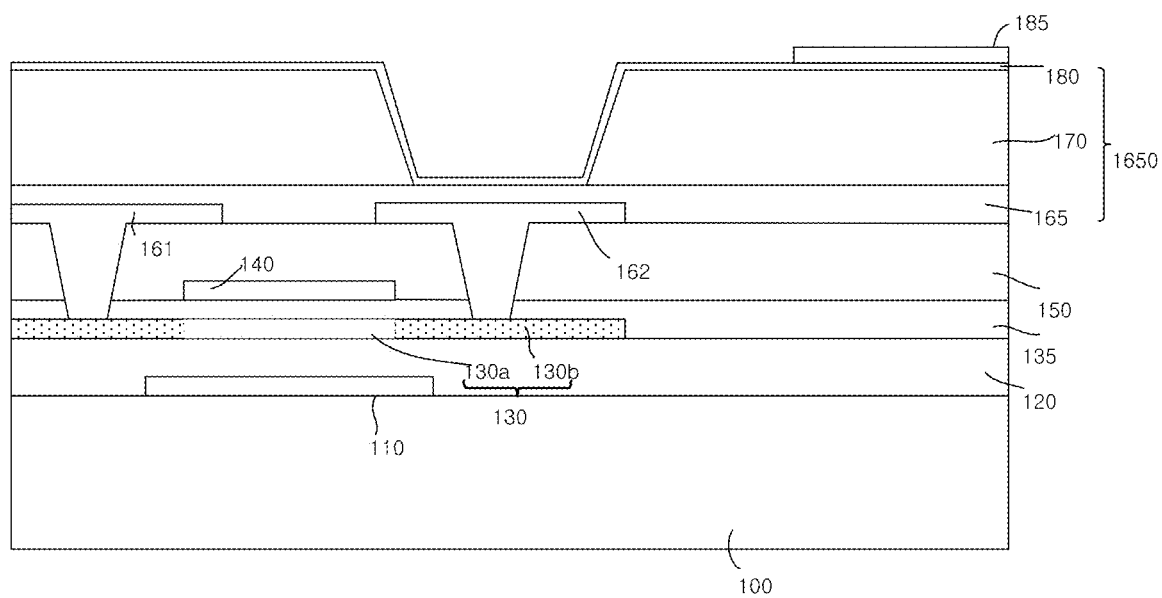
Figure 4H:
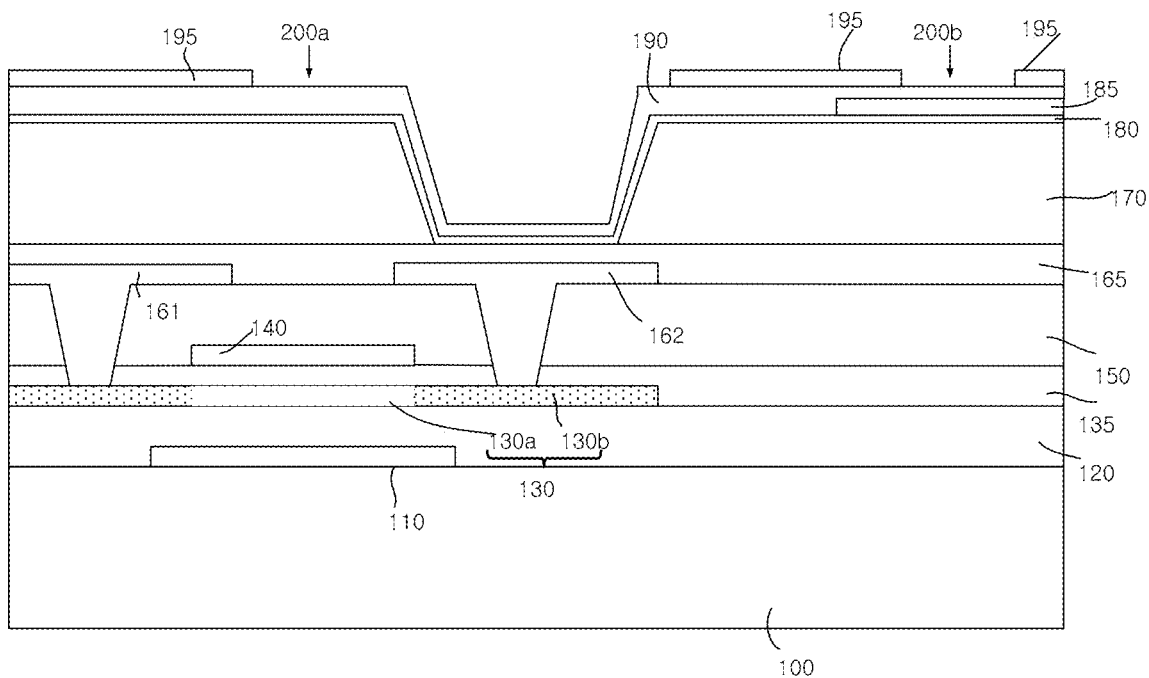

As illustrated in FIG. 4G, the second inorganic insulation layer 180 is formed to cover the organic insulation layer 170.

Sequentially, metal is deposited on the second inorganic insulation layer 180 and is selectively removed using a seventh mask (not shown) to form the sensing line 185 (160S).

Herein, the sensing line 185 is disposed at a different region from the opening hole 170a of the organic insulation layer 170. The sensing line 185 is a line for connecting each common electrode 195 to the touch driver or a touch MUX. The sensing line 185 is formed of metal having high conductivity. The sensing line 185 is used with a material having a higher conductivity than the common electrode 195 of a transparent electrode.

Sequentially, as illustrated in FIG. 4H, the second interlayer dielectric layer 190 is deposited on the sensing line 185. Then, the transparent electrode is entirely formed on the second interlayer dielectric layer 190, and is selectively removed using an eighth mask (not shown) to form a separated common electrode 195 corresponding to each block, as illustrated in FIG. 5A (170S).

The common electrode 195 corresponds to each block. In addition, since each block includes a plurality of pixels, in order to prevent short circuit between the common electrode and the pixel electrode to be formed at each pixel, the common electrode 195 has the first opening hole 200a corresponding to the drain electrode 162 to have the same width as the drain electrode 162. Furthermore, the common electrode 195 has the second opening hole 200b corresponding to a part of the upper surface of the sensing line 185 not to overlap with the common electrode 195.

Figure 4I:
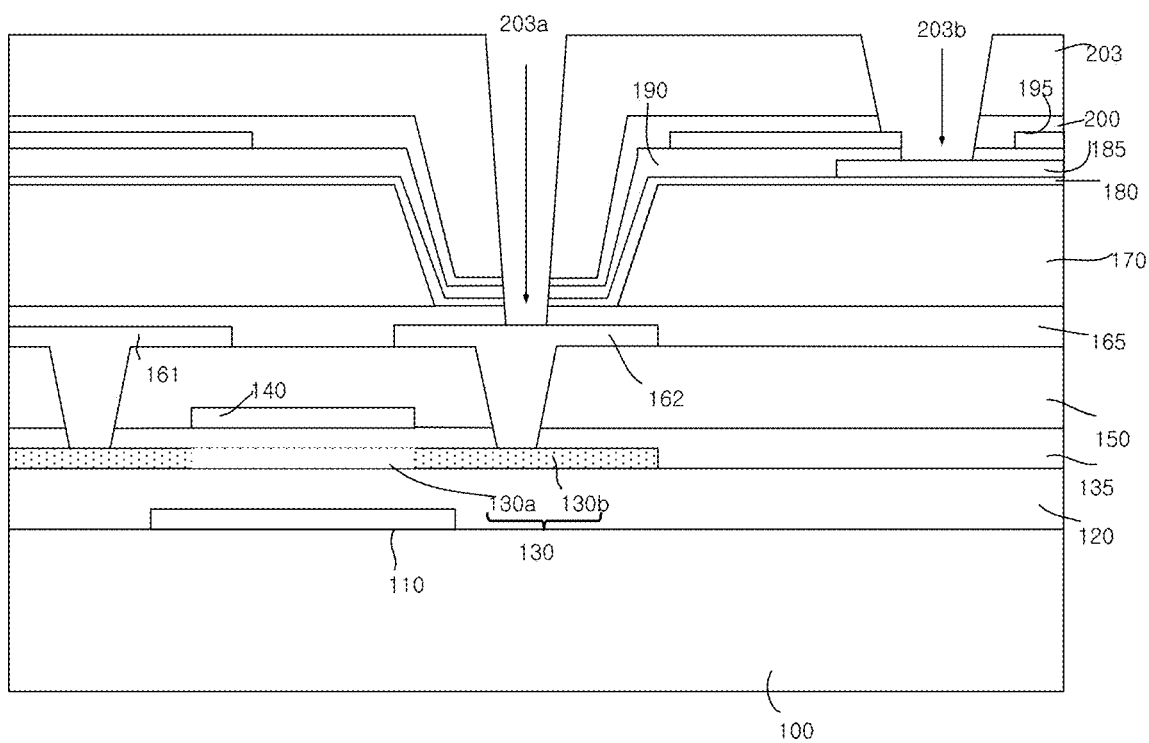

As illustrated in FIG. 4I, the third interlayer dielectric layer 200 is formed on the second interlayer dielectric layer 185 including the common electrode 195.

Then, a photoresist is spread on the third interlayer dielectric layer 200 and is patterned using a ninth mask (not shown) to form a photoresist pattern 203. The photoresist pattern 203 includes a first opening corresponding to the drain electrode 162 and a second opening corresponding to a part of the sensing line 185 exposed by the second opening hole 200b of the common electrode 195 while corresponding to the overlapping region between the common electrode 195 and the sensing line 185.

Sequentially, as illustrated in FIG. 5B, the first interlayer contact hole 203a corresponding to the first opening of the photoresist pattern 203 is formed to continuously pass through the third interlayer dielectric layer 200, the second interlayer dielectric layer 190, and the first interlayer dielectric layer 1650. The second interlayer contact hole 203b corresponding to the second opening hole 200b and the non-overlapping region of the sensing line 185 and the common electrode 195 is formed to pass through the third interlayer dielectric layer 200 and the second interlayer dielectric layer 190 to expose the sensing line 185 (180S). Herein, the common electrode 195 has a second opening hole 200b larger than the second interlayer contact hole 203b. One side of the second interlayer contact hole 203b is in contact with an edge of the second opening hole 200b. In addition, when the connection pattern 205 is formed after forming the second interlayer contact hole 203b, the edge of the second opening hole 200b exposing the connection pattern 205 is in contact with the common electrode 195 and is in contact with the sensing line 185 exposed by the second interlayer contact hole 203b at a lower side thereof. Thereby, connection between the sensing line 185, the common electrode 195, and the connection pattern 205 is formed at the second interlayer contact hole 203b.

The first interlayer contact hole 203a and the second interlayer contact hole 203b are formed using one dry etching process. Each of the first and the second contact holes 203a and 203b has continuity through the interlayer dielectric layers. There is no sudden change in a size of each the first and second interlayer contact holes 203a and 203b at every interlayer dielectric layer.

In addition, the first to third interlayer dielectric layers 1650, 190 and 200 and the exposed common electrode 195 may be etched by a dry etching process using an etchant which has a different etch selectivity between the common electrode 195 formed of a transparent electrode such as an indium tin oxide (ITO) and the second and third interlayer dielectric layers 190 and 200, and in particular, has a high etch selectivity of the inorganic insulation layer, without etching the exposed common electrode 195. Herein, upper and side surfaces of the common electrode 195 are exposed not to be etched by etch selectivity difference between the transparent electrode material of the common electrode and SiNx or SiOx forming the interlayer dielectric layer.

In the method of manufacturing the backplane substrate, the common electrode 195 functions as a barrier when plural interlayer dielectric layers 200, 190, 180 and 165 are simultaneously etched. Thereby, the number of masks may be decreased.

The second interlayer contact hole 203b may be formed to be smaller than the second opening hole 200b of the common electrode 195 disposed at a lower side thereof. In this case, one side of the second interlayer contact hole 203b may be on the same plane as one side of the second opening hole 200b defined upon formation of the common electrode 195. Herein, one side of the second interlayer contact hole 203b and one side of the second opening hole 200b are on the same plane, the second interlayer contact hole 203b has a smaller diameter or width than the second opening hole 200b, and, as such, the remaining region of the second interlayer contact hole 203b may be formed in the second opening hole 200b to be spaced from the second opening hole 200b.

Herein, the upper and side surfaces of the common electrode 195 is exposed by one side of the second interlayer contact hole 203b in the second interlayer contact hole 203b. The sensing line 185 is exposed by a lower side of the second interlayer contact hole 203b. The connection pattern 205 to be formed may be connected to the common electrode 195 and the sensing line 185. In this etching process, although the second interlayer contact hole 203b disposed below the common electrode 195 is partially etched by an anisotropic etching process, a next connection process is performed after exposing the common electrode 195, thereby preventing short circuit due to process fluctuation.

Figure 4J:
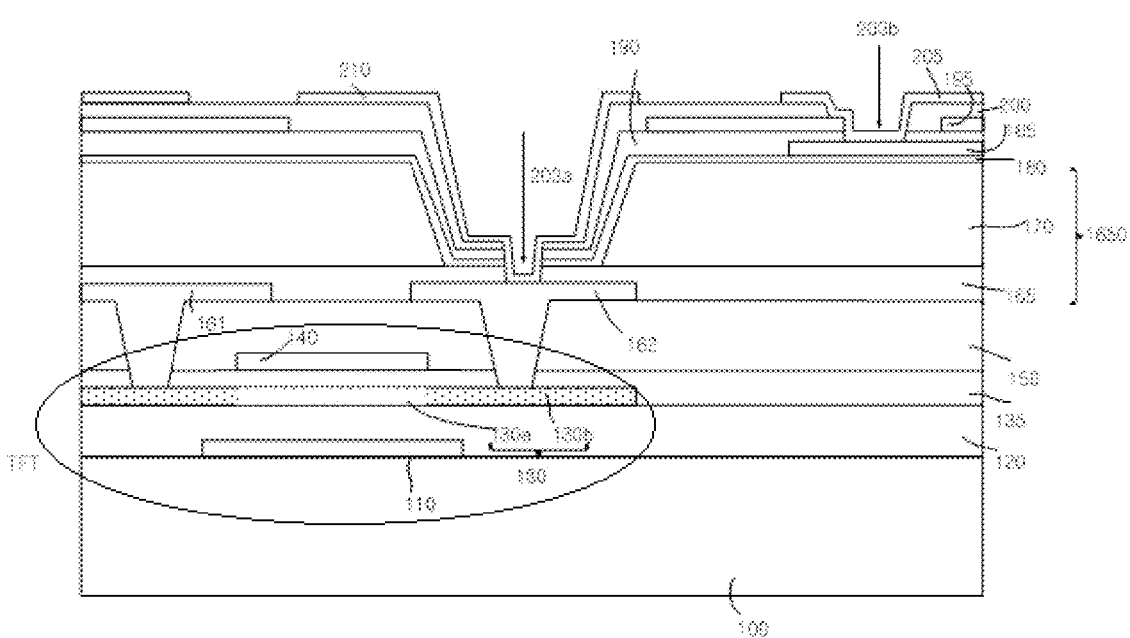

In succession, as illustrated in FIGS. 4J and 5B, the pixel electrode 210 connected to the thin film transistor in each pixel is formed by the first interlayer contact hole 203a continuously passing through the third interlayer dielectric layer 200, the second interlayer dielectric layer 190, and the first interlayer dielectric layer 1650. In the same process, the connection pattern 205 connected to the sensing line 185 is also formed by the second interlayer contact hole 203a (190S).

Furthermore, there may be a size difference between the second opening hole 200b of the common electrode 195 corresponding to the upper surface of the sensing line 185 and the second interlayer contact hole 203b due to process fluctuation. Although there is the size difference therebetween, at least one sides of the second interlayer contact hole 203b is formed to be in contact with the sidewall of the common electrode such that contact between the connection pattern 205 and the upper surface of the sensing line 185 and contact between the connection pattern 205 and the sidewall of the common electrode 195 are simultaneously performed.

Herein, the pixel electrode 210 connected to the drain electrode 162 is spaced from the first opening hole 200a of the common electrode 195 thereby, preventing connection between the pixel electrode 210 and the drain electrode 162 from interfering with the common electrode 195.

In addition, the connection pattern 205 is disposed at the same layer as the pixel electrode 210, but is spaced from the pixel electrode 210 to form an island. The common electrode 195 and the sensing line 185 which are disposed at different layers may be electrically connected to each other through the connection pattern 205 because a signal applied to the pixel electrode 210 is unrelated to the connection pattern 205.

Meanwhile, as illustrated in FIG. 5B, the pixel electrode 210 is patterned as one pattern to correspond to every pixel region but is not limited thereto. The pixel electrode 210 may be formed as a plurality of diverged patterns.

In addition, to achieve the same object, a liquid crystal display device of the present invention will be described.

Figure 6:
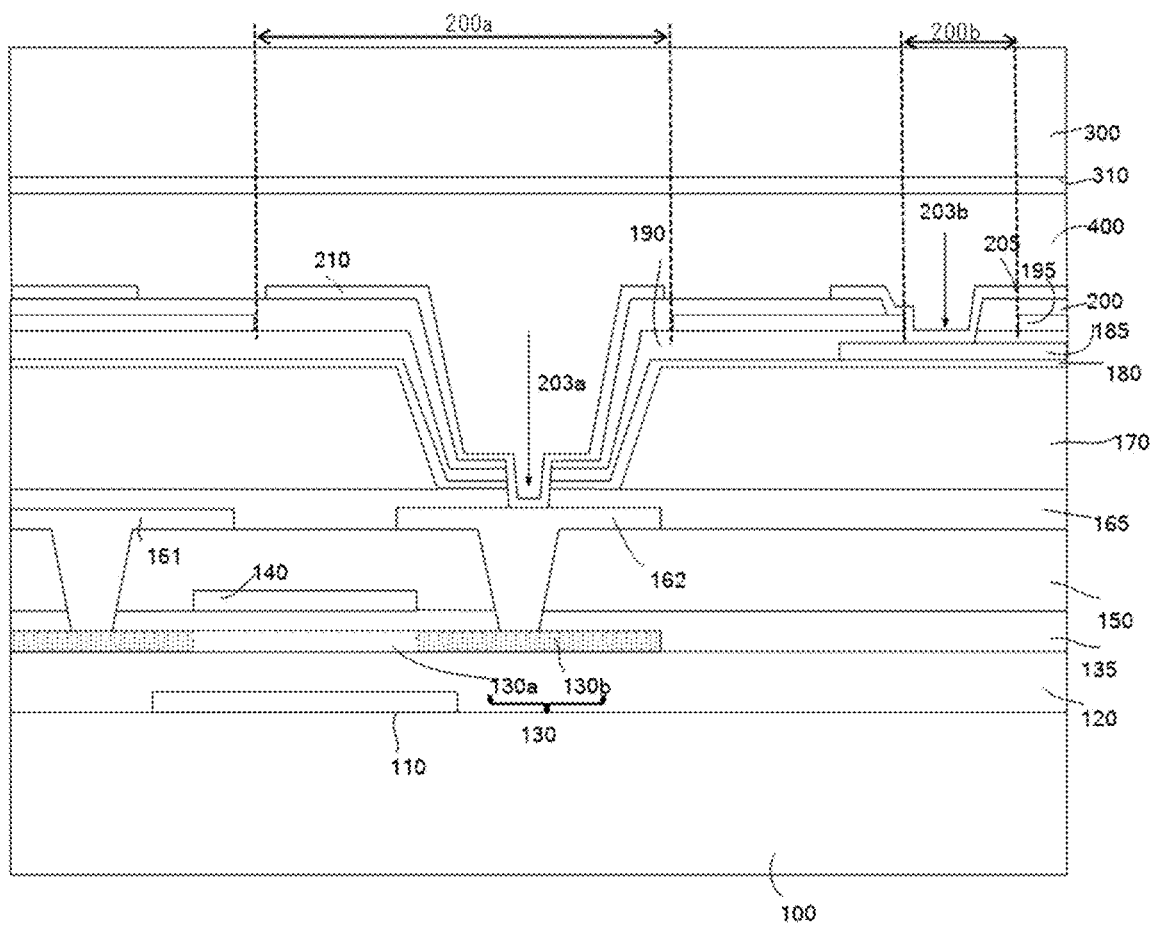
FIG. 6 is a cross-sectional view illustrating a liquid crystal display device including the in-cell type touch panel according to the first embodiment of the present invention.

FIG. 6 is a cross-sectional view illustrating a liquid crystal display device including the in-cell type touch panel according to the first embodiment of the present invention.

The substrate 100 of the backplane substrate formed by the method illustrated in FIGS. 4A to 4J is prepared. As illustrated in FIG. 6, an opposing substrate 300 facing the substrate 100 is prepared, and a liquid crystal layer 400 fills a space between the substrate 100 and the opposing substrate 300. Thereby, an in-cell type liquid crystal display device may be implemented.

In addition, to display color, one of the substrate 100 and the opposing substrate 300 may include a color filter layer 310. In FIG. 6, the color filter layer 310 is disposed at the opposing substrate 300 side, but is not limited thereto. Occasionally, the color filter layer 310 may be disposed to replace the organic insulation layer 170 on the substrate 100.

FIG. 7 is a cross-sectional view illustrating a backplane including an in-cell type touch panel according to a second embodiment of the present invention.

As illustrated in FIG. 7, in the backplane substrate including the in-cell type touch panel according to the second embodiment of the present invention, the opening hole of the common electrode 295 corresponding the second interlayer contact hole 203b has the same width (diameter) as the second contact hole 203b. In this case, the edge (sidewall) of the common electrode 295 is on the same plane as the edge of the second interlayer contact hole 203b, in comparison to the above-described first embodiment.

Except for above structure, the backplane substrate including the in-cell type touch panel according to the second embodiment is the same as the backplane substrate including the in-cell type touch panel according to the first embodiment. Hereinafter, a method of manufacturing the backplane substrate including the in-cell type touch panel according to the second embodiment will be described. In this case, the description starts after formation of the common electrode.

Figure 8A:
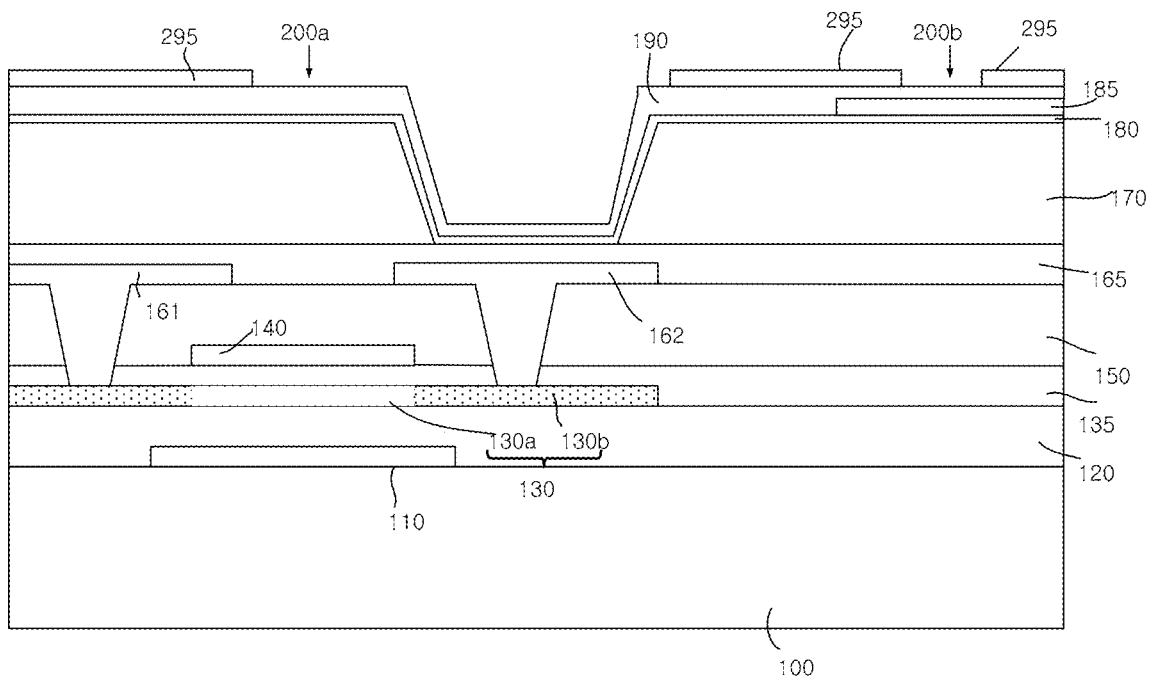
FIGS. 8A to 8C are cross-sectional views illustrating a method of manufacturing the backplane including the in-cell type touch panel according to the second embodiment of the present invention.
Figure 8B:
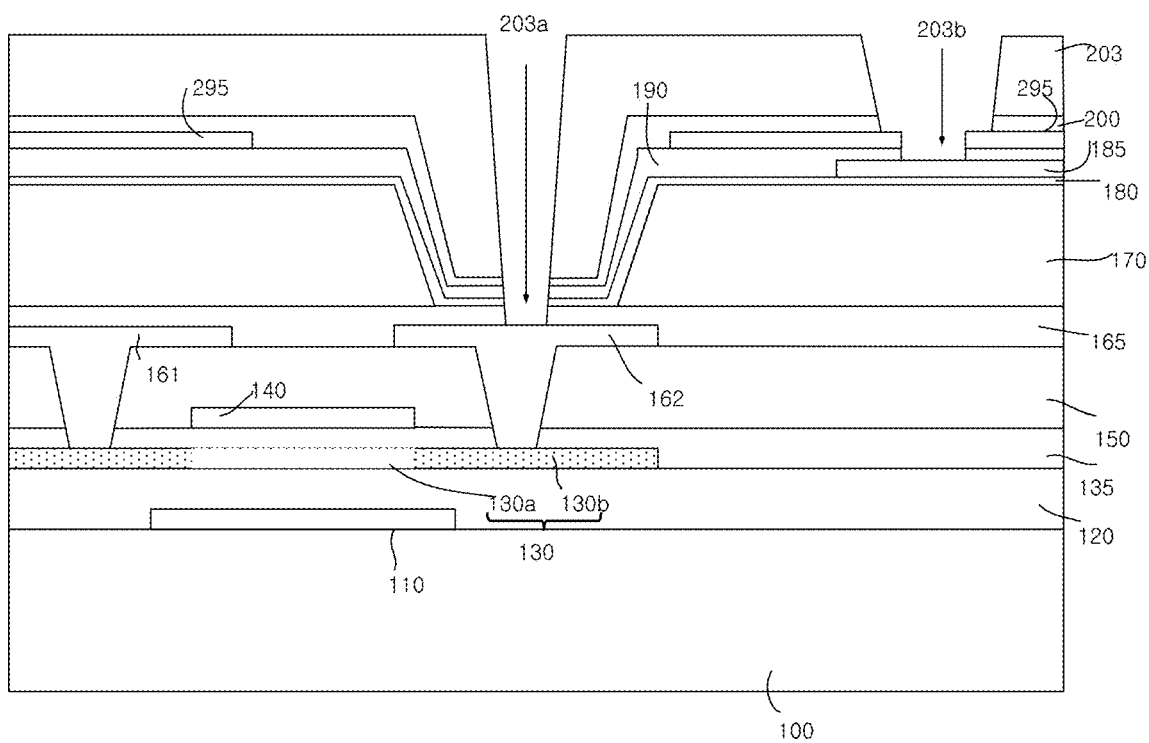
Figure 8C:
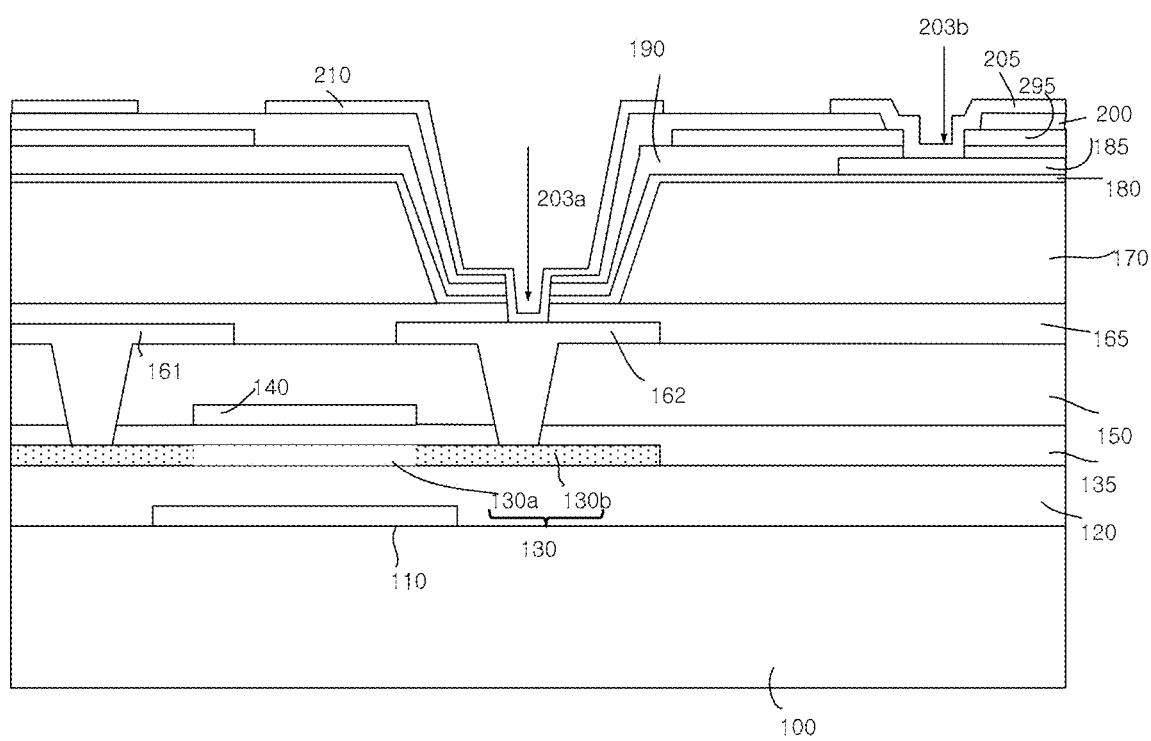

FIGS. 8A to 8C are cross-sectional views illustrating a method of manufacturing the backplane including the in-cell type touch panel according to the second embodiment of the present invention.

As illustrated in FIG. 8A, the second interlayer dielectric layer 190 is deposited on the sensing line 185. The transparent electrode is entirely deposited on the second interlayer dielectric layer 190. The transparent electrode is selectively removed using an eighth mask (not shown) to form common electrodes 295 which are separated from one another to correspond to each block, as illustrated in FIG. 5A.

Herein, since each common electrode 295 corresponds to each block and each block includes a plurality of pixels, in order to prevent short circuit between the common electrode 295 and the pixel electrode, the common electrode 295 has the first opening hole 200a having a width corresponding to the drain electrode 162. In addition, the common electrode 295 has the second opening hole 200b corresponding to a part of the upper surface of the sensing line 185 not to overlap with the common electrode 295. Herein, a diameter (width) of the second opening hole 200b may be different from the above-described first embodiment.

Sequentially, as illustrated in FIG. 8B, the third interlayer dielectric layer 200 is formed on the second interlayer dielectric layer 190 including the common electrode 295. Meanwhile, the third interlayer dielectric layer 200 may function to form a storage capacitor at an overlapping region between the common electrode 295 and the pixel electrode 210 to be formed after forming the common electrode 295.

In succession, a photoresist is spread on the third interlayer dielectric layer 200 and is patterned using a ninth mask (not shown) to form the photoresist pattern 203. The photoresist pattern 203 includes a first opening corresponding to the drain electrode 162 and a second opening corresponding to a part of the sensing line 185 exposed by the second opening hole 200b of the common electrode 295 while corresponding to the overlapping region between the common electrode 295 and the sensing line 185.

Sequentially, the first interlayer contact hole 203a corresponding to the first opening of the photoresist pattern 203 is formed to continuously pass through the third interlayer dielectric layer 200, the second interlayer dielectric layer 190, and the first interlayer dielectric layer 1650. The second interlayer contact hole 203b corresponding to the second opening and the non-overlapping region of the sensing line 185 and the common electrode 295 is formed to pass through the third interlayer dielectric layer 200 and the second interlayer dielectric layer 190 to expose the sensing line 185.

The first interlayer contact hole 203a and the second interlayer contact hole 203b are formed using one dry etching process. Each contact hole has continuity through the interlayer dielectric layers. There is no sudden change in a size of each contact hole at every interlayer dielectric layer.

In addition, the first to third interlayer dielectric layers 1650, 190 and 200 and the exposed common electrode 295 may be etched by a dry etching process using an etchant which has a different etch selectivity between the common electrode 295 formed of a transparent electrode material such as an indium tin oxide (ITO) and the second and third interlayer dielectric layers 190 and 200, and in particular, has a high etch selectivity of the inorganic insulation layer, without etching the exposed common electrode 295. Herein, upper and side surfaces of the common electrode 295 are exposed not to be etched by etch selectivity difference between the transparent electrode material of the common electrode and SiNx or SiOx forming the interlayer dielectric layer.

In the second embodiment, the common electrode 295 functions as a barrier when plural interlayer dielectric layers 200, 190, 180 and 165 are simultaneously etched. Thereby, the number of masks may be decreased.

In this case, the second interlayer contact hole 203b may be formed to be equal to or greater than the second opening hole 200b of the common electrode disposed at a lower side thereof. Herein, although the second interlayer contact hole 203b is formed to be larger than the second opening hole 200b, the common electrode 295 functions as a barrier since etch selectivity between the common electrode 295 and the interlayer dielectric layers is large. Thereby, the third interlayer dielectric layer 200 disposed on the common electrode 295 corresponding to a width or a diameter of the second interlayer contact hole 203b, namely, greater than the width or diameter of the second opening hole 200b, is removed, but the common electrode 295 may maintain the original width or diameter of the second opening hole 200b.

In succession, as illustrated in FIG. 8C, the pixel electrode 210 is formed to be connected to the thin film transistor at every pixel through the first interlayer contact hole 203a passing through the third interlayer dielectric layer 200, the second interlayer dielectric layer 190, and the first interlayer dielectric layer 1650. In the same process, the connection pattern 205 is formed to be connected to the sensing line 185 through the second interlayer contact hole 203b.

Occasionally, an undercut is generated at the second interlayer dielectric layer 190 disposed below the common electrode 295 such that the second interlayer dielectric layer 190 may be removed to have a larger width than the common electrode 295. In this case, the upper and side parts of the common electrode 295 are exposed by the second interlayer contact hole 203b, and the sensing line 185 is exposed by the lower part of the second interlayer contact hole 203b. Thus, a pixel electrode material may be electrically connected to the common electrode 295 and the sensing line 185 during formation of the pixel electrode.

Herein, since the upper and the side parts of the common electrode 295 are exposed by at least one side of the second interlayer contact hole 203b and the sensing line 185 is exposed by the lower part of the second interlayer contact hole 203b, the connection pattern 205 may be electrically connected to the common electrode 295 and the sensing line 185. In the etching process, although the second interlayer dielectric layer 190 disposed below the common electrode 295 is partially removed by isotropic etching, short circuit due to process fluctuation may be prevented since the next connection process is performed after the common electrode is partially exposed.

Furthermore, although there may be size difference between the second opening hole 200b of the common electrode 295 corresponding to the upper part of the sensing line 185 and the second interlayer contact hole 203b due to process fluctuation, the second interlayer contact hole 203b is formed such that at least one side of the second interlayer contact hole 203b is in contact with the sidewall of the common electrode 295. Thereby, contact between the pixel electrode 210 and the drain electrode 162 and side contact between the connection pattern 205 and the common electrode 295 are performed at the same time.

Herein, since the pixel electrode 210 connected to the drain electrode 162 is spaced from the first hole 200a of the common electrode 295, connection between the pixel electrode 210 and the drain electrode 162 does not interfere with the common electrode 295.

In addition, the connection pattern 205 is disposed at the same layer as the pixel electrode 210, but is spaced from the pixel electrode 210 to form an island. The common electrode 295 and the sensing line 185 which are disposed at different layers may be electrically connected to each other through the connection pattern 205 because a signal applied to the pixel electrode 210 is unrelated to the connection pattern 205.

According to the second embodiment, the in-cell type touch panel has the same effect as the first embodiment, except for the described-above manufacturing method. That is, the number of masks and the number of process are decreased. Thus, the in-cell type touch panel according to the second embodiment may be equally applied to a liquid crystal display device.

In the above-described backplane substrate including the in-cell type touch panel, the method of manufacturing the same, and the liquid crystal display device including the same, after formation of the sensing line and the common electrode, a plurality of interlayer dielectric layers is simultaneously etched by dry etching. Thereby, costs may be reduced by decrease of the number of masks.

As is apparent from the above description, according to the present invention, a backplane substrate including an in-cell type touch panel, a liquid crystal display device including the same, and a method of manufacturing the same have advantages as below.

First, one common electrode is provided at each block including a plurality of pixels and the pixel electrode is provided in every pixel. When the pixel electrode is positioned on the common electrode, a plurality of interlayer dielectric layers is simultaneously patterned to form an interlayer contact hole for connection between the thin film transistor and the pixel electrode, thereby decreasing the number of masks.

Second, when the interlayer contact hole is formed, another interlayer contact hole having a different thickness from the interlayer contact hole is formed at the same time to expose the sensing line for independently applying a signal to each common electrode. Thereby, the number of masks and the number of processes may be decreased all together.

Third, after forming the interlayer contact holes having different thicknesses, the pixel electrode and the connection pattern are formed at each interlayer contact hole. Thus, connection between the pixel electrode and the thin film transistor and connection between the connection pattern, the sensing line and the common electrode may be performed at the same time. As a result, the number of masks and the number of processes may be decreased thereby, decreasing manufacturing costs.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backplane substrate including an in-cell type touch panel, comprising:
   a substrate;
   a thin film transistor on the substrate;
   a first insulation layer on the thin film transistor;
   a plurality of touch sensing lines on the first insulation layer;
   a second insulation layer on the touch sensing lines;
   a common electrode on the second insulation layer;
   a third insulation layer on the common electrode; and
   a pixel electrode and a connection pattern on the third insulation layer,
   wherein the pixel electrode is connected to the thin film transistor through a first contact hole of the first insulation layer, and
   wherein the connection pattern is connected to one of the touch sensing lines through a second contact hole of the second insulation layer,
   wherein the connection pattern is connected to the common electrode through a third contact hole of the third insulation layer.

2. The backplane substrate including the in-cell type touch panel of claim 1, wherein the pixel electrode and the connection pattern are formed of a same layer and are separated from each other.

3. The backplane substrate including the in-cell type touch panel of claim 1, wherein the second insulation layer and the third insulation layer have concentric contact holes above the first contact hole of the first insulation layer.

4. The backplane substrate including the in-cell type touch panel of claim 1, wherein the common electrode is configured to be used as an electrode for sensing touch.

5. The backplane substrate including the in-cell type touch panel of claim 1, wherein:
   an electrical signal is applied from one of the touch sensing lines to the common electrode; and
   a touch driver is configured to receive signals applied to the common electrode.

6. The backplane substrate including the in-cell type touch panel of claim 1, wherein:
   the substrate includes a plurality of blocks;
   each block covers some pixels of a plurality of pixels; and
   each touch sensing line is connected to one of the plurality of blocks.

7. The backplane substrate including the in-cell type touch panel of claim 6, wherein each touch sensing line is electrically connected to the one of the plurality of blocks, and is insulated from the other of the plurality of blocks.

8. The backplane substrate including the in-cell type touch panel of claim 1, wherein:
   the common electrode includes a transparent electrode; and
   each of the touch sensing lines includes a metal having high conductivity.

9. The backplane substrate including the in-cell type touch panel of claim 1, wherein the pixel electrode and the connection pattern are formed in a same process.

10. The backplane substrate including the in-cell type touch panel of claim 1, wherein:
    the common electrode has an opening hole corresponding to a part of the upper surface of the one of the plurality of touch sensing lines; and
    the opening hole overlaps the second contact hole.

11. The backplane substrate including the in-cell type touch panel of claim 10, wherein at least one side of the opening hole of the common electrode is spaced apart from the second contact hole.

12. The backplane substrate including the in-cell type touch panel of claim 10, wherein the opening hole of the common electrode is wider than the second contact hole.

13. The backplane substrate including the in-cell type touch panel of claim 10, wherein the second contact hole is within the opening hole of the common electrode.

14. The backplane substrate including the in-cell type touch panel of claim 1, wherein the connection pattern has an island shape spaced apart from the pixel electrode.

15. The backplane substrate including the in-cell type touch panel of claim 1, wherein the second and third insulation layer are formed of an inorganic insulation material.

16. The backplane substrate including the in-cell type touch panel of claim 1, wherein the first insulation layer includes an inorganic insulation material.

17. The backplane substrate including the in-cell type touch panel of claim 1, wherein the first insulation layer includes an organic insulation material.

18. The backplane substrate including the in-cell type touch panel of claim 1, further comprising:
    an opposing substrate facing the substrate; and
    a liquid crystal layer between the substrate and the opposing substrate.

19. The backplane substrate including the in-cell type touch panel of claim 18, further comprising a color filter layer disposed on the substrate or on the opposing substrate.

* * * * *